US012550564B2

(12) United States Patent
Chen et al.

(10) Patent No.: US 12,550,564 B2
(45) Date of Patent: Feb. 10, 2026

(54) WIRING STRUCTURE OF PIXEL DRIVING CIRCUIT, DISPLAY PANEL, AND DISPLAY DEVICE

(71) Applicant: BOE TECHNOLOGY GROUP CO., LTD., Beijing (CN)

(72) Inventors: Yipeng Chen, Beijing (CN); Libin Liu, Beijing (CN); Yunfei Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/734,140

(22) Filed: Jun. 5, 2024

(65) Prior Publication Data

US 2024/0324369 A1    Sep. 26, 2024

Related U.S. Application Data

(63) Continuation of application No. 17/891,211, filed on Aug. 19, 2022, now Pat. No. 12,048,212, which is a
(Continued)

(30) Foreign Application Priority Data

Apr. 4, 2018   (CN) .......................... 201810300615.4

(51) Int. Cl.
*H01L 29/12*     (2006.01)
*G09G 3/3258*    (2016.01)
(Continued)

(52) U.S. Cl.
CPC ......... *H10K 59/131* (2023.02); *G09G 3/3258* (2013.01); *H10K 59/1213* (2023.02);
(Continued)

(58) Field of Classification Search
CPC ............ H10K 59/131; H10K 59/1213; H10K 59/1216; G09G 3/3258; G09G 2300/0842;
(Continued)

(56) References Cited

U.S. PATENT DOCUMENTS 9,231,039 B2    1/2016  Kim
12,048,212 B2*  7/2024  Chen .................... H10K 59/131
(Continued)

FOREIGN PATENT DOCUMENTS

CN    103077683 A    5/2013
CN    205004335 U *  1/2016
(Continued)

OTHER PUBLICATIONS

Cite the machine translation Zheng W (CN-205004335-U).*
(Continued)

*Primary Examiner* — Phuc T Dang
(74) *Attorney, Agent, or Firm* — Calfee, Halter & Griswold LLP

(57) ABSTRACT

Provided are a wiring structure of a pixel driving circuit, a display panel, and a display device. The wire layout includes: a first switching element, a second switching element and a driving transistor. A source electrode of the driving transistor is connected to a power signal line. The power signal line includes a first power signal line that is in a same direction as a data signal line, and the data signal line is arranged at a position of the first power signal line away from a gate electrode of the driving transistor.

18 Claims, 6 Drawing Sheets

Related U.S. Application Data continuation of application No. 16/614,813, filed as application No. PCT/CN2019/079821 on Mar. 27, 2019, now Pat. No. 11,450,723.

(51) Int. Cl.
  *H10K 59/121* (2023.01)
  *H10K 59/131* (2023.01)
  *H10D 86/40* (2025.01)
  *H10D 86/60* (2025.01)

(52) U.S. Cl.
  CPC . *H10K 59/1216* (2023.02); *G09G 2300/0842* (2013.01); *G09G 2310/0262* (2013.01); *G09G 2320/0209* (2013.01); *H10D 86/441* (2025.01); *H10D 86/481* (2025.01); *H10D 86/60* (2025.01)

(58) Field of Classification Search
  CPC ... G09G 3300/0262; G09G 2320/0209; H10D 86/441; H10D 86/60; H10D 86/481
  USPC .......................................................... 257/71
  See application file for complete search history.

(56) References Cited

U.S. PATENT DOCUMENTS

| | | |
|---|---|---|
| 2014/0320544 A1 | 10/2014 | Kim |
| 2015/0154899 A1 | 6/2015 | Chang |
| 2017/0148861 A1* | 5/2017 | Kim ..................... H10K 59/122 |
| 2017/0221979 A1* | 8/2017 | Chae .................... H10K 59/126 |
| 2018/0130409 A1 | 5/2018 | Xiang |
| 2018/0166518 A1 | 6/2018 | Kim |
| 2019/0014664 A1 | 1/2019 | Ahn |

FOREIGN PATENT DOCUMENTS

| | | |
|---|---|---|
| CN | 103077683 B | 8/2016 |
| CN | 107274829 A | 10/2017 |
| CN | 108511497 A | 9/2018 |
| KR | 20140127048 A | 11/2014 |
| KR | 20150027906 A | 3/2015 |

OTHER PUBLICATIONS

Office action from U.S. Appl. No. 17/891,211 dated Jun. 28, 2023.
Notice of Allowance from U.S. Appl. No. 17/891,211 dated Mar. 11, 2024.
Office action from U.S. Appl. No. 17/891,211 dated Oct. 23, 2023.
Notice of Allowance from U.S. Appl. No. 16/614,813 dated May 17, 2022.
Office action from U.S. Appl. No. 16/614,813 dated Feb. 11, 2022.
Written Opinion from PCT/CN2019/079821 dated Jul. 2, 2019.
International Search Report from PCT/CN2019/079821 dated Jul. 2, 2019.
Office action from Chinese Application No. 201810300615.4 dated Mar. 17, 2020.

* cited by examiner

WIRING STRUCTURE OF PIXEL DRIVING CIRCUIT, DISPLAY PANEL, AND DISPLAY DEVICE

The present application is a continuation application of U.S. application Ser. No. 17/891,211, U.S. Pat. No. 12,048,212, which is a continuation application of U.S. application Ser. No. 16/614,813, U.S. Pat. No. 11,450,723, which is a § 371 national phase application of PCT/CN2019/079821 filed on Mar. 27, 2019, which claims the benefit of and priority to Chinese Patent Application No. 201810300615.4, entitled "WIRE LAYOUT OF A PIXEL DRIVING CIRCUIT, DISPLAY PANEL, AND DISPLAY DEVICE", filed on Apr. 4, 2018, the contents of which are incorporated herein in their entireties.

TECHNICAL FIELD

The present disclosure relates to the display technologies, and particularly to a wire layout of a pixel driving circuit, a display panel, and a display device.

BACKGROUND

With the development of self-luminous display technologies, OLED (Organic Light Emitting Diode) displays have gradually replaced traditional LCD (Liquid Crystal Display) with their advantages of low power consumption, low cost, wide viewing angle, fast response, and so on.

It should be noted that the information disclosed in the Background section above is only for enhancing the understanding of the background of the present disclosure, and thus may include information that does not constitute prior art known to those of ordinary skill in the art.

SUMMARY

According to an aspect of the present disclosure, a wire layout of a pixel driving circuit is provided, including: a first switching element, a control terminal of the first switching element being coupled to a scan signal line, a first terminal of the first switching element being coupled to a data signal line, and a second terminal of the first switching element being coupled to a first node; and a driving transistor, a control terminal of the driving transistor being coupled to a second node, a first terminal of the driving transistor being coupled to a power signal line, and a second terminal of the driving transistor being coupled to a third node; wherein the power signal line includes a first power signal line that is in the same direction as the data signal line, and a first distance between the data signal line and the control terminal of the driving transistor is greater than a second distance between the first power signal line and the control terminal of the driving transistor.

In an exemplary embodiment of the present disclosure, the first power signal line and the data signal line are located on the same side of the control terminal of the driving transistor.

In an exemplary embodiment of the present disclosure, the pixel driving circuit further includes: a storage capacitor, the first node being coupled to a first plate of the storage capacitor through a first wire, and the second node being coupled to a second plate of the storage capacitor through a second wire, wherein the scan signal line does not overlap with the first wire and/or the second wire.

In an exemplary embodiment of the present disclosure, the power signal line further includes a second power signal line that is in the same direction as the scan signal line, and an extension portion that extends from the second power signal line and has an overlapping region with the data signal line.

In an exemplary embodiment of the present disclosure, the second power signal line is disposed on the same layer as the extension portion, the first power signal line is disposed on the same layer as the data signal line, and the second power signal and the first power signal line are disposed on different layers and connected with each other through a via.

In an exemplary embodiment of the present disclosure, an overlapping area between the data signal line and the extension portion is determined according to voltage jump values at the control terminal and the first terminal of the driving transistor.

In an exemplary embodiment of the present disclosure, the first distance between the data signal line and the control terminal of the driving transistor is determined according to voltage jump values at the control terminal and the first terminal of the driving transistor. In an exemplary embodiment of the present disclosure, the pixel driving circuit further includes: a second switching element, a control terminal of the second switching element being coupled to the scan signal line, a first terminal of the second switching element being coupled to the second node, and a second terminal of the second switching element being coupled to the third node.

In an exemplary embodiment of the present disclosure, the first switching element and the second switching element are both MOS transistors.

According to an aspect of the present disclosure, a display panel is provided, including the above pixel driving circuit.

According to an aspect of the present disclosure, a display device is provided, including the above display panel.

It should be noted that the above general description and the following detailed description are merely exemplary and explanatory and should not be construed as limiting of the disclosure.

BRIEF DESCRIPTION OF THE DRAWINGS

The accompanying drawings, which are incorporated in the specification and constitute a part of the specification, show exemplary embodiments of the present disclosure. The drawings along with the specification explain the principles of the present disclosure. It is understood that the drawings in the following description show only some of the embodiments of the present disclosure, and other drawings may be obtained by those skilled in the art without departing from the drawings described herein.

DETAILED DESCRIPTION

Figure 1:
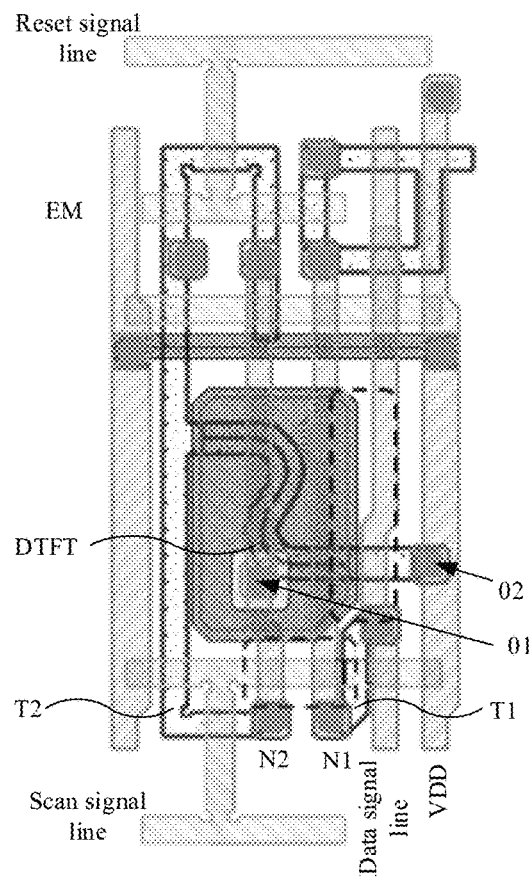
FIG. 1 schematically shows a diagram of a wire layout of a pixel driving circuit in the related art.

Example embodiments will now be described more fully with reference to the accompanying drawings. However, the embodiments can be implemented in a variety of forms and should not be construed as being limited to the examples set forth herein; rather, these embodiments are provided so that this disclosure will be more complete so as to convey the idea of the exemplary embodiments to those skilled in this art. The described features, structures, or characteristics in one or more embodiments may be combined in any suitable manner.

In addition, the drawings are merely schematic representations of the present disclosure and are not necessarily drawn to scale. The same reference numerals in the drawings denote the same or similar parts, and the repeated description thereof will be omitted. Some of the block diagrams shown in the figures are functional entities and do not necessarily correspond to physically or logically separate entities. These functional entities may be implemented in software, or implemented in one or more hardware modules or integrated circuits, or implemented in different networks and/or processor devices and/or microcontroller devices.

In a wire layout of a pixel driving circuit of an AMOLED (Active-Matrix Organic Light Emitting Diode) display, parasitic capacitances exist between a data signal line and a gate of a driving transistor, and between the data signal line and a source of the driving transistor. However, since the degree of coupling between the data signal line and the gate of the driving transistor is stronger than the degree of coupling between the data signal line and the source of the driving transistor, the jump amplitude of the gate voltage Vg of the driving transistor is greater than the jump amplitude of the source voltage Vs of the driving transistor when the voltage of the data signal line jumps, and accordingly, a difference Vgs between the gate voltage and the source voltage of the driving transistor changes. As a result, a local brightness variation will occur on a display screen of the display, which causes crosstalk of the display.

FIG. 1 schematically shows a diagram of a wire layout of a pixel driving circuit in the related art.

As shown in FIG. 1, parasitic capacitances exist between a data signal line Data and a gate 01 (coupled to a second node N2) of a driving transistor DTFT, and between the data signal line Data and a source 02 (coupled to a power signal line VDD) of the driving transistor DTFT. Since a distance between the data signal line Data and the gate of the driving transistor DTFT is relatively short, the degree of coupling between the data signal line Data and the gate 01 of the driving transistor DTFT is stronger than the degree of coupling between the data signal line Data and the source 02 of the driving transistor DTFT. In this way, when the voltage of the data signal line Data jumps, for example, when crosstalk test screen is displayed, the jump amplitude of the gate voltage Vg of the driving transistor DTFT is greater than the jump amplitude of the source voltage Vs of the driving transistor DTFT. For example, when the voltage of the data signal line Data jumps towards a low level, the falling amplitude of the gate voltage Vg is greater than the falling amplitude of the source voltage Vs, and the difference Vgs between the gate voltage and the source voltage of the driving transistor DTFT decreases, thereby causing a local brightness increase of the display. As another example, when the voltage of the data signal line Data jumps towards a high level, the rising amplitude of the gate voltage Vg is greater than the rising amplitude of the source voltage Vs, and the difference Vgs between the gate voltage and the source voltage of the driving transistor DTFT increases, thereby causing a local brightness decrease of the display.

In view of the problems described above, exemplary embodiments of the present disclosure provide a wire layout of a pixel driving circuit, which can be applied to a wiring design of an OLED pixel driving circuit. The OLED pixel driving circuit can be a pixel driving circuit that determines different degrees of coupling existing between the data signal line Data and the gate and source of the driving transistor by a crosstalk test, such as the pixel driving circuit shown in FIG. 2 and FIG. 3. However, embodiments of the present disclosure are not limited to such circuits. The degree of coupling between the data signal line Data and the gate and the source of the driving transistor can be tested in the following manner: under the crosstalk test screen with the voltage jump, an oscilloscope tests the jump of the gate and source leads of the driving transistor. The crosstalk test images can be, for example, a gray scale at L128 (the most brightest at L255 gray scale), and a black block of the test images or a white block of the test images is set in the background, wherein the black block indicates voltage jumps downwards, and the white block indicates voltage jumps upwards.

Figure 2:
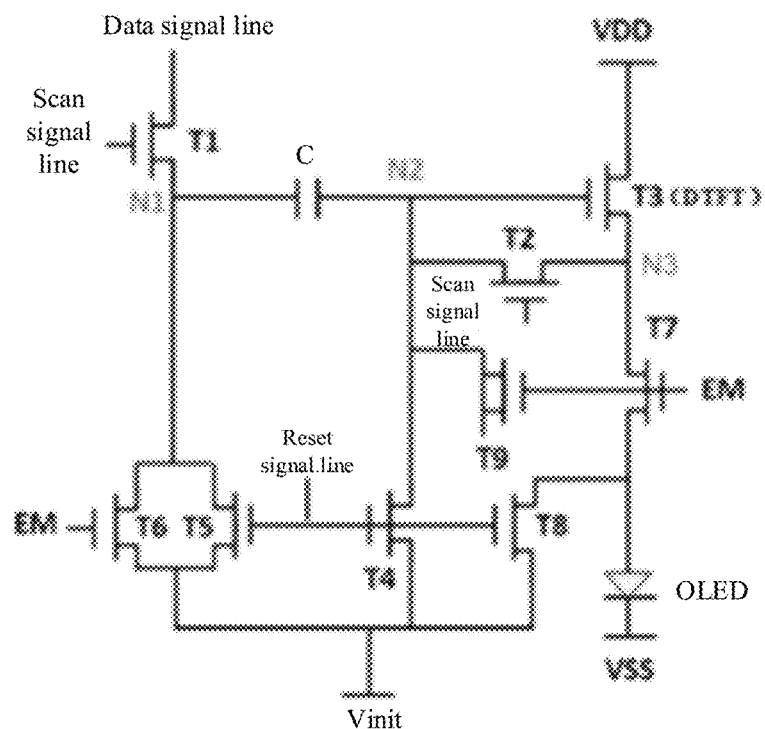
FIG. 2 schematically shows a schematic diagram 1 of a pixel driving circuit in an exemplary embodiment of the present disclosure.

FIG. 2 schematically shows a schematic diagram 1 of a pixel driving circuit in an exemplary embodiment of the present disclosure.

As shown in FIG. 2, the pixel driving circuit provided in the embodiment of the present disclosure may include a first switching element T1, a second switching element T2, a third switching element T3 (serving as a driving transistor DTFT), a fourth switching element T4, a fifth switching element T5, the sixth switching element T6, the seventh switching element T7, the eighth switching element T8, and a ninth switching element T9. The pixel driving circuit may further include a storage capacitor C and an organic light emitting diode (OLED).

In the embodiment as shown in FIG. 2, the control terminal of the first switching element T1 can be coupled to a scan signal line Gate. The first terminal of the first switching element T1 can be coupled to a data signal line Data, and the second terminal of the first switching element T1 can be coupled to a first node N1. The control terminal of the second switching element T2 can be coupled to the scan signal line Gate. The first terminal of the second switching element T2 can be coupled to the second node N2, and the second terminal of the second switching element T2 can be coupled to the third node N3. The control terminal (e.g., the gate) of the driving transistor DTFT can be coupled to the second node N2. The first terminal (e.g., the source) of the driving transistor DTFT can be coupled to the first power signal line VDD, and the second terminal (e.g., the drain) of the driving transistor DTFT may be coupled to the third node N3. The control terminal of the fourth switching element T4 can be coupled to the reset signal line Reset. The first terminal of the fourth switching element T4 can be coupled to the second node N2, and the second terminal of the fourth switching element T4 can be coupled to the initialization signal line Vinit. The control terminal of the fifth switching element T5 can be coupled to the reset signal line Reset, the first terminal of the fifth switching element T5 can be coupled to the first node N1, and the second terminal of the fifth switching element T5 can be coupled to the initialization signal line Vinit. The control terminal of the sixth switching element T6 can be coupled to the illumination control signal line EM, the first terminal of the sixth switching element T6 can be coupled to the first node N1, and the second terminal of the sixth switching element T6 can be coupled to the initialization signal line Vinit. The control terminal of the seventh switching element T7 can be coupled to the illumination control signal line EM, the first terminal of the seventh switching element T7 can be coupled to the third node N3, and the second terminal of the seventh switching element T7 can be coupled to the first terminal of the organic light emitting diode (OLED). The control terminal of the eighth switching element T8 can be coupled to the reset signal line Reset, the first terminal of the eighth switching element T8 can be coupled to the second terminal of the seventh switching element T7, and the second terminal of the eighth switching element T8 can be coupled to the initialization signal line Vinit. The control terminal of the ninth switching element T9 can be coupled to the illumination control signal line EM, the first terminal of the ninth switching element T9 can be coupled to the second node N2, and the second terminal of the ninth switching element T9 is a float. The ninth switching element T9 is equivalent to a capacitor. The first plate (or called as the first electrode or first terminal) of the storage capacitor C can be coupled to the first node N1, and the second plate (or called as the second electrode or the second terminal) of the storage capacitor C can be coupled to the second node N2. The second terminal of the organic light emitting diode (OLED) may be coupled to the third power signal line VSS.

Figure 3:
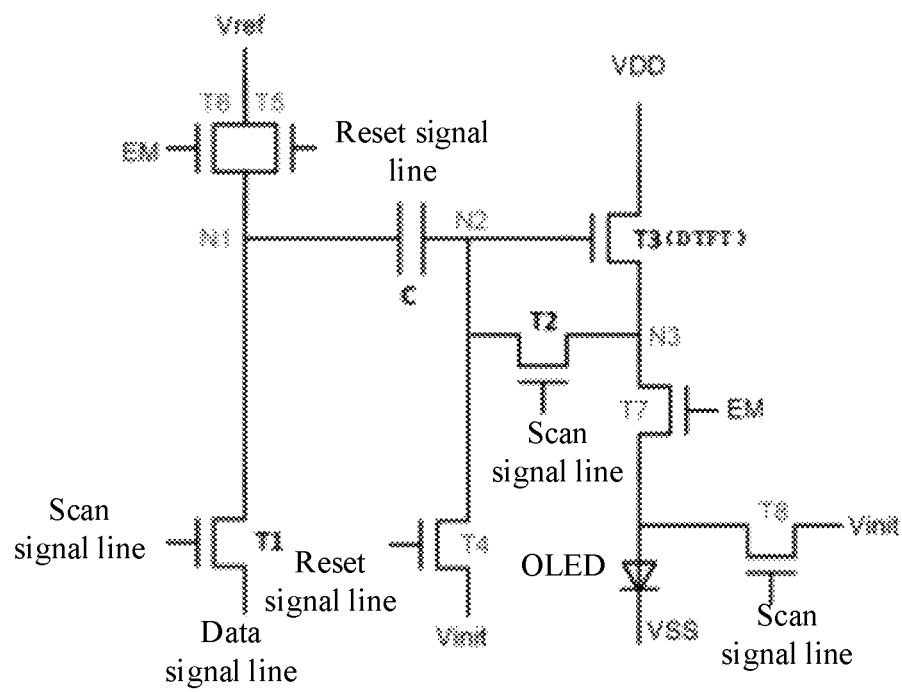
FIG. 3 schematically shows a schematic diagram 2 of a pixel driving circuit in an exemplary embodiment of the present disclosure.

FIG. 3 schematically shows a schematic diagram 2 of a pixel driving circuit in an exemplary embodiment of the present disclosure.

As shown in FIG. 3, the pixel driving circuit provided in the embodiment of the present disclosure may include a first switching element T1, a second switching element T2, a third switching element T3 (serving as a driving transistor DTFT), a fourth switching element T4, a fifth switching element T5, a sixth switching element T6, a seventh switching element T7, and an eighth switching element T8. The pixel driving circuit may further include a storage capacitor C and an organic light emitting diode (OLED).

In the embodiment shown in FIG. 3, the control terminal of the first switching element T1 can be coupled to the scan signal line Gate, the first terminal of the first switching element T1 can be coupled to the data signal line Data, and the second terminal of the first switching element T1 can be coupled to the first node N1. The control terminal of the second switching element T2 can be coupled to the scan signal line Gate, the first terminal of the second switching element T2 can be coupled to the second node N2, and the second terminal of the second switching element T2 can be coupled to the third node N3. The control terminal (e.g., the gate) of the driving transistor DTFT can be coupled to the second node N2, the first terminal (e.g., the source) of the driving transistor DTFT can be coupled to the first power signal line VDD, and the second terminal (e.g., the drain) of the driving transistor DTFT can be coupled to the third node N3. The control terminal of the fourth switching element T4 can be coupled to the reset signal line Reset, the first terminal of the fourth switching element T4 can be coupled to the second node N2, and the second terminal of the fourth switching element T4 can be coupled to the initialization signal line Vinit. The control terminal of the fifth switching element T5 can be coupled to the reset signal line Reset, the first terminal of the fifth switching element T5 can be coupled to the first node N1, and the second terminal of the fifth switching element T5 can be coupled to the reference voltage signal line Vref. The control terminal of the sixth switching element T6 can be coupled to the illumination control signal line EM, the first terminal of the sixth switching element T6 can be coupled to the first node N1, and the second terminal of the sixth switching element T6 can be coupled to the reference voltage signal line Vref. The control terminal of the seventh switching element T7 can be coupled to the illumination control signal line EM, the first terminal of the seventh switching element T7 can be coupled to the third node N3, and the second terminal of the seventh switching element T7 can be coupled to the first terminal of the organic light emitting diode (OLED). The control terminal of the eighth switching element T8 can be coupled to the scan signal line Gate, the first terminal of the eighth switching element T8 can be coupled to the second terminal of the seventh switching element T7, and the second terminal of the eighth switching element T8 can be coupled to the initialization signal line Vinit. The first plate (or called as the first electrode or the first terminal) of the storage capacitor C can be coupled to the first node N1, and the second plate (or called as the second electrode or the second terminal) of the storage capacitor C can be coupled to the second node N2. The second terminal of the organic light emitting diode (OLED) may be coupled to the third power signal line VSS.

Figure 4:
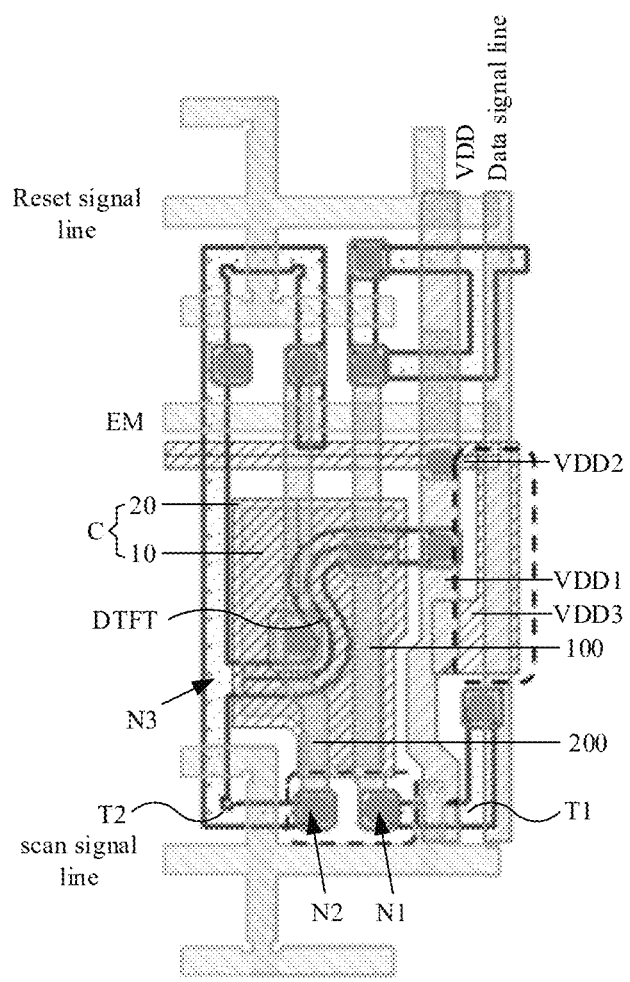
FIG. 4 schematically shows a diagram of a wire layout of a pixel driving circuit in an exemplary embodiment of the present disclosure.
Figure 5:
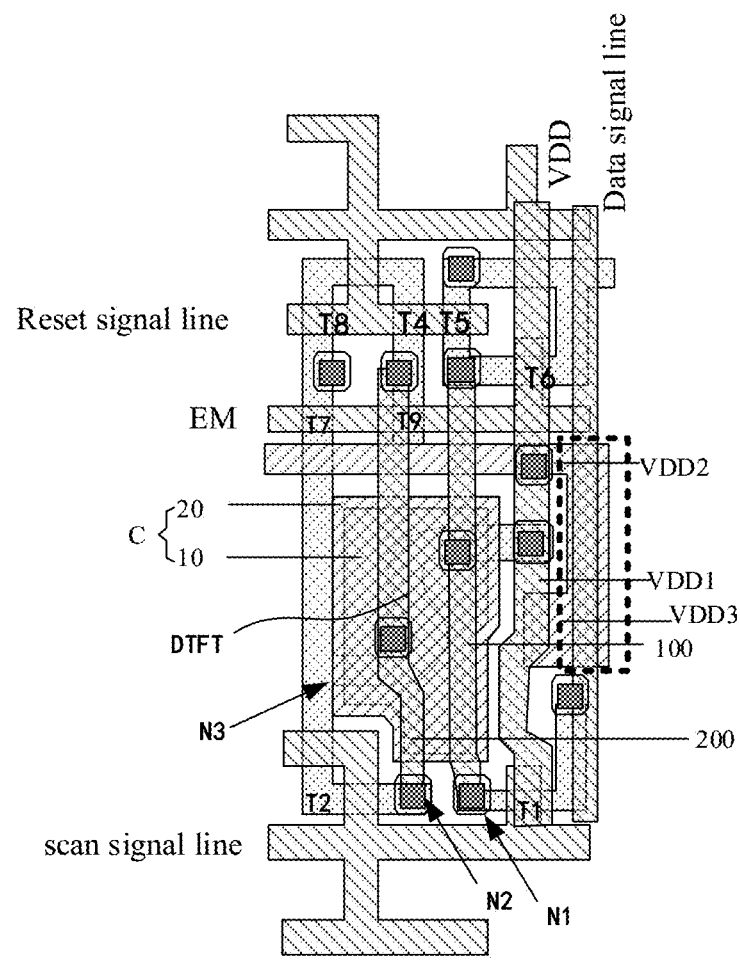
FIG. 5 is a diagram of a wire layout of a pixel driving circuit in an exemplary embodiment of the present disclosure.
Figure 6:
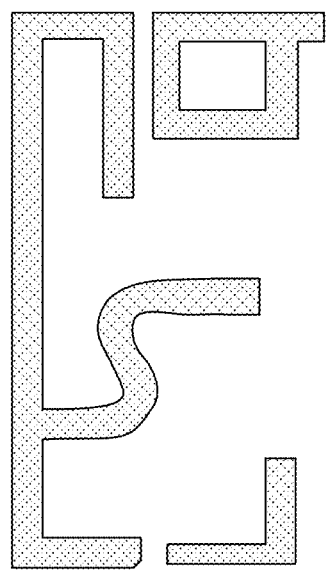
FIG. 6 to FIG. 9 show layers of the wire layout of the pixel driving circuit in exemplary embodiments of the present disclosure.
Figure 7:
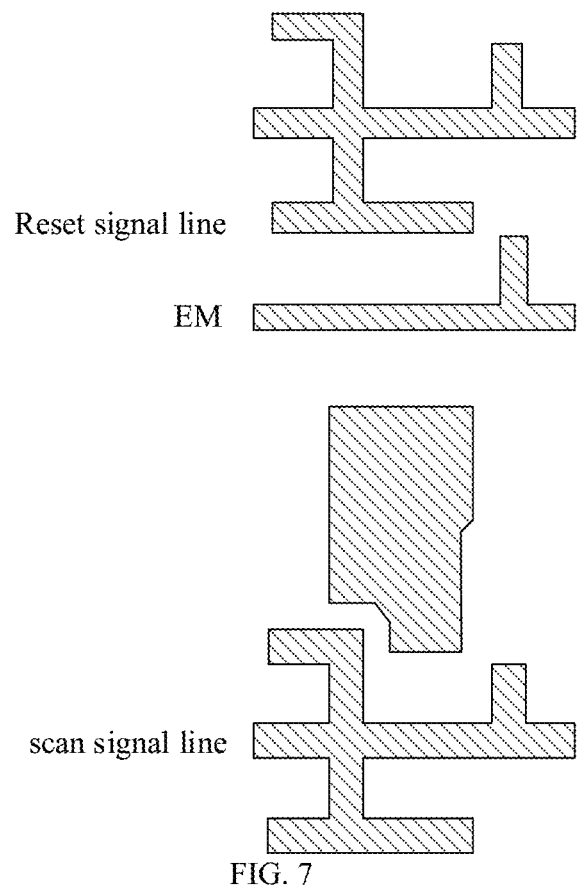
Figure 8:
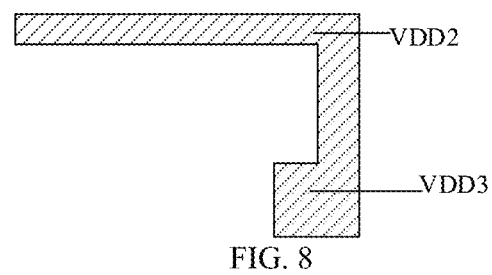
Figure 9:
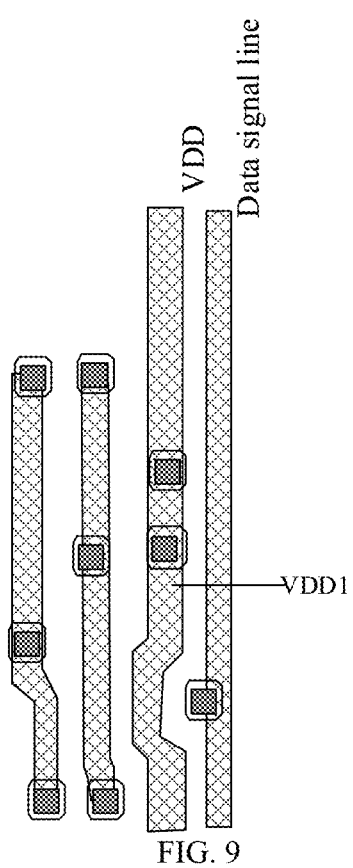

FIG. 4 schematically shows a diagram of a wire layout of a pixel driving circuit in an exemplary embodiment of the present disclosure. FIG. 5 is a diagram of a wire layout of a pixel driving circuit in an exemplary embodiment of the present disclosure. FIG. 6 to FIG. 9 show layers of the wire layout of the pixel driving circuit in exemplary embodiments of the present disclosure.

As shown in FIG. 4 to FIG. 9, a scan signal line Gate is disposed in a first direction (for example a lateral direction), a data signal line Data is disposed in a second direction (for example a vertical direction), and a power signal line VDD is also disposed to provide power signals. The power signal line VDD may include at least a first power signal line VDD1 that is in the same direction as the data signal line Data. For example, the extending direction of the first power signal line VDD1 and the extending direction of the data signal line Data may be the same.

The pixel driving circuit may include: a first switching element T1, a control terminal of the first switching element T1 being coupled to a scan signal line Gate, a first terminal of the first switching element T1 being coupled to a data signal line Data, and a second terminal of the first switching element T1 being coupled to a first node N1; a second switching element T2, a control terminal of the second switching element T2 being coupled to the scan signal line Gate, a first terminal of the second switching element T2 being coupled to a second node N2, and a second terminal of the second switching element T2 being coupled to the third node N3; a driving transistor DTFT, a gate of the driving transistor DTFT being coupled to the second node N2, a source of the driving transistor DTFT being coupled to a power signal line VDD, and a drain of the driving transistor DTFT being coupled to a third node N3; and a storage capacitor C, the first node N1 being coupled to the first plate 10 of the storage capacitor C, and the second node N2 being coupled to the second plate 20 of the storage capacitor C.

In the wire layout of the pixel driving circuit, the first power signal line VDD1 and the data signal line Data are both disposed on the same side of the gate of the driving transistor DTFT. For example, as shown in FIG. 4, the first power signal line VDD1 and the data signal line Data are both disposed on the right side of the gate of the driving transistor DTFT. A first distance between the data signal line Data and the gate of the driving transistor DTFT is greater than a second distance between the first power signal line VDD1 and the gate of the driving transistor DTFT, that is, the first power signal line VDD1 is disposed close to the gate of the driving transistor DTFT, and the data signal line Data is disposed away from the gate of the driving transistor DTFT.

The pixel driving circuit provided by the exemplary embodiment of the present disclosure increases the distance between the data signal line Data and the gate of the driving transistor DTFT by adjusting the wiring position of the data signal line Data, thereby reducing the degree of coupling between the data signal line Data and the gate of the driving transistor DTFT. Accordingly, the difference between the gate voltage and the source voltage of the driving transistor DTFT is reduced, so that the problem of local brightness unevenness of the display can be improved, thereby improving the crosstalk phenomenon of the display.

In the example embodiment, the first node N1 may be coupled to the first plate 10 through a first wire 100, and the second node N2 may be coupled to the second plate 20 through a second wire 200. It should be noted that FIG. 4 only exemplarily indicates the relative positions of the first plate 10 and the second plate 20. In an actual arrangement, the first plate 10 may be disposed above the second plate 20, or the first plate 10 may be disposed under the second plate 20.

Referring to FIG. 1, in the related art, in addition to the fact that the data signal line Data is closer to the gate of the driving transistor DTFT, which results in a stronger coupling degree between the data line Data and the gate of the driving transistor DTFT, a larger series capacitance is also generated between the data signal line Data and the first wire 100 (the first node N1) and the second wire 200 (the second node N2) through the scan signal line Gate, thereby further enhancing the coupling degree between the data signal line Data and the gate of the driving transistor DTFT.

In order to solve the above problem, referring to FIG. 4, the present exemplary embodiment can control there being no overlap between the scan signal line Gate and the first wire 100 and the second wire 200, thereby preventing the data signal line Data from generating series capacitance with the first wire 100 (the first node N1) and the second wire 200 (the second node N2) through the scan signal line Gate, and further reducing the degree of coupling between the data signal line Data and the gate of the driving transistor DTFT. The scan signal line Gate does not overlap with the first wire 100 and the second wire 200, for example, by moving the portion of the scan signal line Gate originally overlapping the first wire 100 and the second wire 200 downwards, or by adjusting the positions of the first terminal of the first switching element T1 and the first terminal of the second switching element T2.

In the present exemplary embodiment, as shown in FIG. 4, the power signal line VDD may include a second power signal line VDD2 in the same direction as the scan signal line Gate and the extension portion VDD3 extending from the second power signal line VDD2 and having an overlapping region with the data signal line Data, in addition to the first power signal line VDD1 in the same direction as the data signal line Data, thereby increasing the parasitic capacitance between the data signal line Data and the power signal line VDD. Since the power signal line VDD is coupled to the source of the driving transistor DTFT, the parasitic capacitance between the data signal line Data and the power signal line VDD is increased, and then the parasitic capacitance between the data signal line Data and the source of the driving transistor DTFT is increased, thereby increasing the degree of the coupling between the data signal line Data and the source of the driving transistor DTFT. The larger the overlapping area between the data signal line Data and the extension portion VDD3 of the power signal line VDD is, the more significantly the increasing of the degree of the coupling between the signal line Data and the source of the driving transistor DTFT will be.

On the basis of the above embodiments, in order to simplify the preparation processes, the first power signal line VDD1 and the data signal line Data can be disposed on the same layer, the second power signal line VDD2 and the extension portion VDD3 can be disposed on the same layer, and the second power signal line VDD2 and the first power signal line VDD1 may be disposed on different layers and connected with each other through the via.

In exemplary embodiments, the first distance between the data signal line Data and the gate of the driving transistor DTFT and the overlapping area between the data signal line Data and the extension portion VDD3 of the power signal line VDD can be determined, for example, according to pre-acquired voltage jump values at the gate and the source of the driving transistor DTFT under the test condition. The test conditions have been described in detail above, and are not described herein again.

In the wire layout according to embodiments of the present disclosure, on one hand, the degree of coupling between the data signal line Data and the gate of the driving transistor DTFT can be reduced by adjusting the wiring position of the data signal line Data and, on the other hand, the degree of coupling between the data signal line Data and the gate of the driving transistor DTFT can be further reduced by making no overlap between the scan signal line Gate and the first node N1 and the second node N2. Further, the degree of coupling between the data signal line Data and the source of the driving transistor DTFT can be further increased by setting the extension portion VDD3 of the power signal line VDD having an overlapping region with the data signal line Data. In the embodiments, the stability of the difference Vgs between the gate voltage and the source voltage of the driving transistor DTFT can be ensured by the above-described wire layout, thereby addressing the problem of local brightness unevenness of the display, for example, in the crosstalk test screen, thereby solving the crosstalk problem of the display.

In the exemplary embodiment, the first switching element T1 and the second switching element T2 may both be MOS (Metal-Oxide-Semiconductor) transistors, such as P-type MOS transistors or N-type MOS transistors. It should be noted that the wire layout of the pixel driving circuit may further include other transistors and signal lines such as those in FIG. 2 or FIG. 3. Taking FIG. 2 as an example, the pixel driving circuit may further include a reset signal line Reset, the illumination control signal line EM, an initialization signal line Vinit, a third power signal line VSS, and fourth to ninth switching elements (T4~T9). Or, taking FIG. 3 as an example, the pixel driving circuit may further include a reset signal line Reset, the illumination control signal line EM, an initialization signal line Vinit, a third power signal line VSS, and fourth to eighth switching elements (T4~T8). In the actual wire layout of the pixel driving circuit, the layout design of each switching element can be performed according to the coupling relationship shown in FIG. 2 or FIG. 3, which will not be enumerated here.

An exemplary embodiment also provides a display panel including the above pixel driving circuit. The display panel can exhibit better brightness stability when the crosstalk test is performed, and thus has good display quality.

An exemplary embodiment of the present disclosure also provides a display device including the above display panel. The display device may include any product or component having a display function, such as a mobile phone, a tablet computer, a television, a notebook computer, a digital photo frame, a navigator, and the like.

It should be noted that although modules or units of devices for executing functions are described above, such division of modules or units is not mandatory. In fact, features and functions of two or more of the modules or units described above may be embodied in one module or unit in accordance with the embodiments of the present disclosure. Alternatively, the features and functions of one module or unit described above may be further divided into multiple modules or units.

In addition, although the various steps of the method of the present disclosure are described in a particular order in the figures, this is not required or implied that the steps must be performed in the specific order, or all the steps shown must be performed to achieve the desired result. Additionally or alternatively, certain steps may be omitted, multiple steps may be combined into one step, and/or one step may be decomposed into multiple steps and so on.

Other embodiments of the present disclosure will be apparent to those skilled in the art. The present application is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative, and the real scope and spirit of the present disclosure is defined by the appended claims.

It is to be understood that the present disclosure is not limited to the precise structures that have been described above and shown in the drawings, and various modifications and changes can be made without departing from the scope thereof. The scope of the present disclosure is to be limited only by the appended claims.

What is claimed is:

1. A wire layout of a pixel driving circuit, comprising:
a first switching element, wherein a control terminal of the first switching element is connected to a scan signal line, a first terminal of the first switching element is connected to a data signal line, and a second terminal of the first switching element is connected to a first node;
a second switching element, wherein a first terminal of the second switching element is connected to a second node, and a second terminal of the second switching element is connected to a third node; and
a driving transistor, wherein a gate electrode of the driving transistor is connected to the second node, a source electrode of the driving transistor is connected to a power signal line, a drain electrode of the driving transistor is connected to the third node, and the first switching element is connected to an electrode of a storage capacitor;
wherein the power signal line comprises a first power signal line that is in a same direction as the data signal line, and the data signal line is arranged at a position of the first power signal line away from the gate electrode of the driving transistor;
wherein the pixel driving circuit further comprises the storage capacitor, the electrode of the storage capacitor connected to the first switching element is a first plate of the storage capacitor, the first node is connected to the first plate of the storage capacitor through a first wire, and the second node is to a second plate of the storage capacitor through a second wire,
wherein the scan signal line does not overlap with the first wire and the second wire.

2. The wire layout of the pixel driving circuit according to claim 1, wherein the data signal line extends along a second direction, the first power signal line comprises a first portion, a second portion and a third portion which extend along a direction same as the second direction;
wherein an extending direction of a portion between the first portion and the second portion forms an angle with the second direction, and an extending direction of a portion between the second portion and the third portion forms an angle with the second direction.

3. The wire layout of the pixel driving circuit according to claim 2, wherein a distance between the data signal line and a side of the second portion of the first power signal line away from the data signal line is greater than a distance between the data signal line and a side of the first portion of the first power signal line away from the data signal line.

4. The wire layout of the pixel driving circuit according to claim 1, wherein an active layer of the second switching element and an active layer of the driving transistor are formed integrally, and the second switching element and the driving transistor are arranged adjacently.

5. A display panel, comprising the wire layout of the pixel driving circuit according to claim 1.

6. A display device, comprising the display panel of claim 5.

7. A wire layout of a pixel driving circuit, comprising:
a first switching element, wherein a control terminal of the first switching element is connected to a scan signal line, a first terminal of the first switching element is connected to a data signal line, and a second terminal of the first switching element is connected to a first node;
a second switching element, wherein a first terminal of the second switching element is connected to a second node, and a second terminal of the second switching element is connected to a third node; and
a driving transistor, wherein a gate electrode of the driving transistor is connected to the second node, a source electrode of the driving transistor is connected to a power signal line, a drain electrode of the driving transistor is connected to the third node, and the first switching element is connected to an electrode of a storage capacitor;
wherein the power signal line comprises a first power signal line that is in a same direction as the data signal line, and the data signal line is arranged at a position of the first power signal line away from the gate electrode of the driving transistor, wherein the pixel driving circuit further comprises a fourth switching element and an eighth switching element, orthographic projections of the fourth switching element and the eighth switching element on a base substrate are arranged at a same side of an orthographic projection of the driving transistor on the base substrate, and an active layer of the fourth switching element and an active layer of the eighth switching element are formed integrally.

8. The wire layout of the pixel driving circuit according to claim 7, wherein the fourth switching element is configured to write an initialization signal to the second node, and the eighth switching element is configured to write the initialization signal to an anode of a light emitting device connected to the pixel driving circuit.

9. The wire layout of the pixel driving circuit according to claim 7, wherein the pixel driving circuit further comprises a fifth switching element, and orthographic projections of the fifth switching element and the first switching element on the base substrate are arranged at a same side of the orthographic projection of the driving transistor on the base substrate;
wherein the control terminal of the first switching element and a control terminal of the fifth switching element are input with different signals, and the fifth switching element is configured to write an initialization signal to the first node.

10. The wire layout of the pixel driving circuit according to claim 9, wherein the pixel driving circuit further comprises a seventh switching element;
wherein a control terminal of the seventh switching element and a control terminal of the second switching element are input with different signals, and the control terminal of the second switching element and the control terminal of the seventh switching element are made of a same metal layer.

11. The wire layout of the pixel driving circuit according to claim 9, wherein the pixel driving circuit further comprises a first capacitor, and an orthographic projection of the first capacitor on the base substrate does not overlap with an orthographic projection of the storage capacitor on the base substrate.

12. The wire layout of the pixel driving circuit according to claim 11, wherein the power signal line further comprises a comprises a second power signal line that is in a same direction as the scan signal line;
wherein a first plate of the first capacitor is coupled with the second power signal line, and a signal of a second plate of the first capacitor is related to a signal provided by the data signal line.

13. The wire layout of the pixel driving circuit according to claim 12, wherein the first capacitor is adjacent to the storage capacitor.

14. The wire layout of the pixel driving circuit according to claim 11, wherein the pixel driving circuit further comprises a sixth switching element, and a control terminal of the sixth switching element is connected to a light emitting control signal line;
wherein orthographic projections of the first capacitor and the storage capacitor on the base substrate are arranged between orthographic projections of the first switching element and the sixth switching element on the base substrate.

15. The wire layout of the pixel driving circuit according to claim 11, wherein orthographic projections of the first capacitor and the storage capacitor on the base substrate are arranged between orthographic projections of the first switching element and the eighth switching element on the base substrate.

16. The wire layout of the pixel driving circuit according to claim 12, wherein one of the first plate and the second plate of the first capacitor and one of the first plate and the second plate of the storage capacitor are made of a same metal layer.

17. The wire layout of the pixel driving circuit according to claim 12, wherein the first power signal line and the data signal layer are arranged in a same layer, and a via is provided in the second power signal line.

18. A wire layout of a pixel driving circuit, wherein the pixel driving circuit comprises:
a first switching element, wherein a control terminal of the first switching element is connected to a scan signal line, a first terminal of the first switching element is connected to a data signal line, and a second terminal of the first switching element is connected to a first node;
a second switching element, wherein a first terminal of the second switching element is connected to a second node, and a second terminal of the second switching element is connected to a third node; and
a driving transistor, wherein a gate electrode of the driving transistor is connected to the second node, a source electrode of the driving transistor is connected to a power signal line, a drain electrode of the driving transistor is connected to the third node, and the first switching element is connected to an electrode of a storage capacitor;
wherein the power signal line comprises a first power signal line that is in a same direction as the data signal line, the first power signal line overlaps with the driving transistor, and the data signal line does not overlap with the driving transistor;
wherein the pixel driving circuit further comprises the storage capacitor, the electrode of the storage capacitor connected to the first switching element is a first plate of the storage capacitor, the first node is connected to the first plate of the storage capacitor through a first wire, and the second node is to a second plate of the storage capacitor through a second wire,
wherein the scan signal line does not overlap with the first wire and the second wire.

* * * * *